(12) United States Patent
Cha et al.

(10) Patent No.: US 12,144,143 B2
(45) Date of Patent: Nov. 12, 2024

(54) ELECTRIC RANGE AND AIR GUIDE FOR ELECTRIC RANGE

(71) Applicant: LG ELECTRONICS INC., Seoul (KR)

(72) Inventors: Jungmin Cha, Seoul (KR); Junghyeon Cho, Seoul (KR); Jinwoo Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 843 days.

(21) Appl. No.: 17/195,789

(22) Filed: Mar. 9, 2021

(65) Prior Publication Data

US 2021/0289660 A1 Sep. 16, 2021

(30) Foreign Application Priority Data

Mar. 12, 2020 (KR) .................. 10-2020-0030922

(51) Int. Cl.
*H05K 7/20* (2006.01)
*F24C 7/08* (2006.01)
(Continued)

(52) U.S. Cl.
CPC ......... *H05K 7/20172* (2013.01); *F24C 7/082* (2013.01); *F24C 15/006* (2013.01);
(Continued)

(58) Field of Classification Search
None
See application file for complete search history.

(56) References Cited

U.S. PATENT DOCUMENTS

2004/0129692 A1  7/2004  Kim et al.
2008/0142512 A1  6/2008  Kim et al.
(Continued)

FOREIGN PATENT DOCUMENTS

CN       1507783       6/2004
CN     105708347       6/2016
(Continued)

OTHER PUBLICATIONS

Translation of FR-3000177-A1 (Year: 2014).*
(Continued)

*Primary Examiner* — Elizabeth M Kerr
(74) *Attorney, Agent, or Firm* — KED & ASSOCIATES

(57) ABSTRACT

An electric range is provided. The electric range may include a case; at least one heating unit configured to heat an object; at least one drive circuit configured to drive the heating unit; at least one display configured to display visual information; at least one air blowing fan configured to output air; and at least one air guide configured to guide air output from the air blowing fan to the drive circuit. The air output from the air blowing fan may be supplied to a first end of the air guide, and a height of an upper surface of the first end of the air guide may be greater than a height of an upper surface of the air blowing fan. A first portion of the air output from the air blowing fan may be discharged through a gap between the upper surface of the first end of the air guide and the upper surface of the air blowing fan, and supplied to the display.

12 Claims, 16 Drawing Sheets

(51) Int. Cl.
*F24C 15/00* (2006.01)
*H05B 6/12* (2006.01)
*H05B 6/42* (2006.01)

(52) U.S. Cl.
CPC ............ *H05B 6/1209* (2013.01); *H05B 6/42* (2013.01); *H05K 7/20145* (2013.01)

(56) References Cited

U.S. PATENT DOCUMENTS

| | | | |
|---|---|---|---|
| 2012/0008276 A1* | 1/2012 | Cheng | ................... G06F 1/20 361/679.48 |
| 2016/0178216 A1 | 6/2016 | Lee | |
| 2018/0352614 A1 | 12/2018 | Holzinger et al. | |
| 2019/0116689 A1* | 4/2019 | Chen | .................. H05K 7/20154 |

FOREIGN PATENT DOCUMENTS

| | | | | | |
|---|---|---|---|---|---|
| CN | 206347612 | | 7/2017 | | |
| EP | 1 936 283 | | 6/2008 | | |
| EP | 3 177 108 | | 6/2017 | | |
| EP | 2498574 | | 6/2017 | | |
| FR | 3000177 | A1 * | 6/2014 | ............. | F24C 7/082 |
| KR | 101819370 | B1 * | 1/2018 | ......... | H05K 7/20145 |
| KR | 10-2018-0025011 | | 3/2018 | | |
| KR | 10-2018-0026141 | | 3/2018 | | |
| KR | 20180025011 | A * | 3/2018 | ........... | H05B 6/1263 |
| KR | 20180027903 | A * | 3/2018 | ......... | H05K 7/20145 |
| KR | 20180079868 | | 7/2018 | | |
| WO | WO 2018048184 | | 3/2018 | | |

OTHER PUBLICATIONS

Translation of KR-20180027903-A (Year: 2018).*
Translation of KR-20180025011-A (Year: 2018).*
Translation of KR-101819370-B1 (Year: 2018).*
Chinese Office Action dated Apr. 24, 2023 issued in Application No. 202110230803.6.
European Search Report dated Aug. 9, 2021 issued in EP Application No. 21162103.2.
European Communication dated Jun. 26, 2024 issued in Application No. 21162103.2.

* cited by examiner 120a,120b,120c 120a,120b,120c 706   702   704 708

ELECTRIC RANGE AND AIR GUIDE FOR ELECTRIC RANGE

CROSS-REFERENCE TO RELATED APPLICATION(S)

This application claims priority to and the benefit of Korean Patent Application No. 10-2020-0030922, filed in Korea on Mar. 12, 2020, the disclosure of which is incorporated herein by reference in its entirety.

BACKGROUND

1. Field

An electric range and an air guide for an electric range are disclosed herein.

2. Background

Various types of cooking appliances are used to heat food or other items (hereinafter, collectively "food") at homes or restaurants. The cooking appliances include gas ranges using gas and electric ranges using electricity.

The electric ranges are classified as resistance heating-type electric ranges and induction heating-type electric ranges. In a resistance heating method, electric current is supplied to a metallic resistance wire or a non-metallic heat generation element, such as silicon carbide to generate heat, and the generated heat is radiated or conducted to heat an object to be heated, for example, a cooking vessel, such as a pot, or a frying pan, for example. In an induction heating method, high-frequency power is supplied to a coil to generate a magnetic field around the coil, and eddy current produced in the generated magnetic field is used to heat an object to be heated made of a metallic material.

Regarding basic theories of induction heating, when electric current is supplied to a working coil or a heating coil, heat is generated while an object to be heated is inductively heated, and the object to be heated is heated by the generated heat.

FIGS. 1A-1B are views showing a related art induction heating device. FIGS. 1A-1B are disclosed in Korean Patent Publication No. 10-2018-0026141, which is hereby incorporated by reference.

Referring to FIG. 1, a cool air flow inducing member 27 supports a heating unit 22, and guides a flow of cool air blown by a cooling unit 26 to electric components and a light source unit 24. In other words, the cool air flow inducing member 27 is provided between the heating unit 22 and the cooling unit 26, and forms a flow passage of cool air.

However, in the related art, the cold air is only induced to pass through a lower portion of the heating unit 22 and the light source unit 24, and there is a problem in that it is not possible to concentrate cold air on high-temperature components among the electric components below the heating unit 22. In addition, the related art has a problem in that the light source unit 24 cannot be cooled in a concentrated manner.

BRIEF DESCRIPTION OF THE DRAWINGS

Embodiments will be described in detail with reference to the following drawings in which like reference numerals refer to like elements, and wherein.

DETAILED DESCRIPTION

Figure 1A:
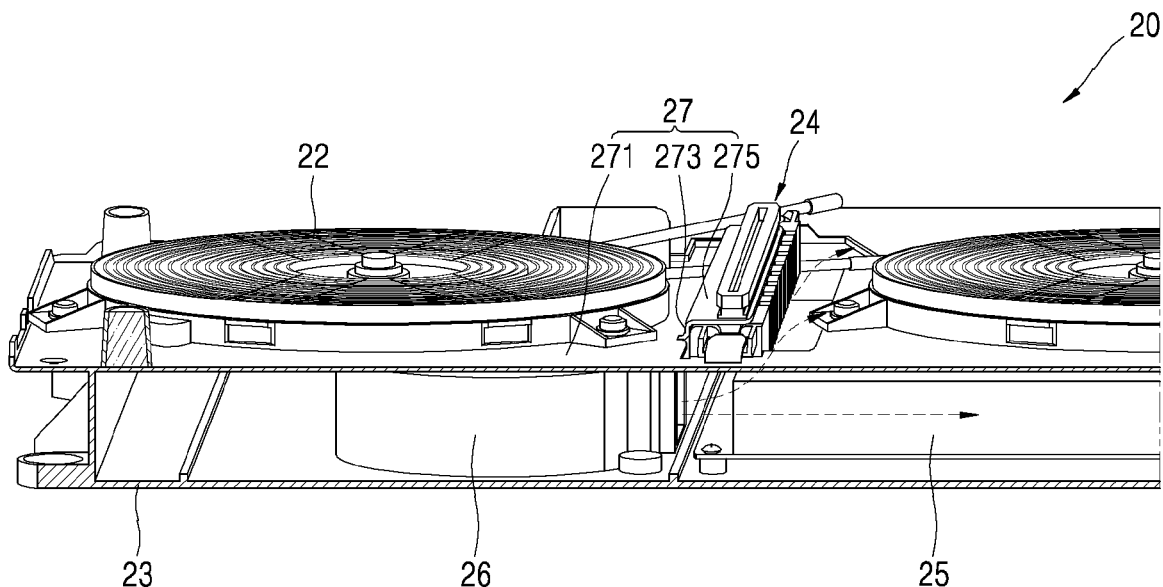
FIGS. 1A-1B are views showing a related art induction heating device.
Figure 1B:
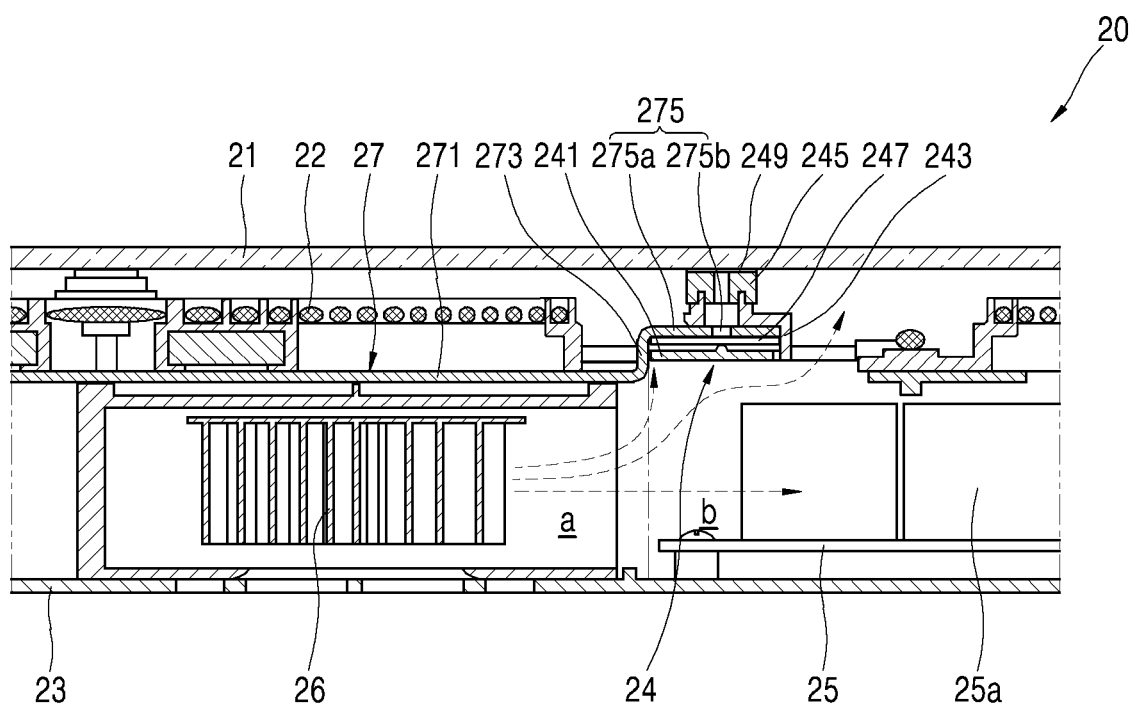

Embodiments are described hereinafter with reference to the accompanying drawings such that one having ordinary skill in the art to which the embodiments pertain may easily implement the technical idea. In the disclosure, description of known technologies in relation to the disclosure is omitted if it is deemed to make the gist unnecessarily vague. In the drawings, the same or like reference numerals denote the same or like components.

The terms "first", "second" and the like are used herein only to distinguish one component from another component. Thus, the components should not be limited by the terms. Certainly, a first component can be a second component unless stated to the contrary.

When one component is described as being "in an upper portion (or a lower portion)" of another component, or "on (or under)" another component, one component can be placed on the upper surface (or under the lower surface) of another component, and an additional component may be interposed between another component and one component on (or under) another component.

When one component is described as being "connected", "coupled", or "connected" to another component, one component can be directly connected, coupled or connected to another component; however, it is also to be understood that an additional component can be "interposed" between the two components, or the two components can be "connected", "coupled", or "connected" through an additional component.

Hereinafter, each component may be provided as a single one or a plurality of ones, unless explicitly stated to the contrary.

The singular forms "a", "an" and "the" are intended to include the plural forms as well, unless explicitly indicated otherwise. It should be further understood that the terms "comprise" or "have," set forth herein, are not interpreted as necessarily including all the stated components or steps but can be interpreted as including some of the stated components or steps or can be interpreted as further including additional components or steps.

Hereinafter, the terms "A and/or B" as used herein can denote A, B or A and B, and the terms "C to D" can denote C or greater and D or less, unless stated to the contrary.

Hereinafter, an electric range is described with reference to several embodiments. The electric range disclosed herein may include an electric resistance-type electric range and an induction heating-type electric range, for example, an induction heating device. For convenience, an induction heating device, provided with a working coil as a heating unit, is described as an example during description of the embodiments. However, embodiments are not limited to those set forth herein.

Figure 2:
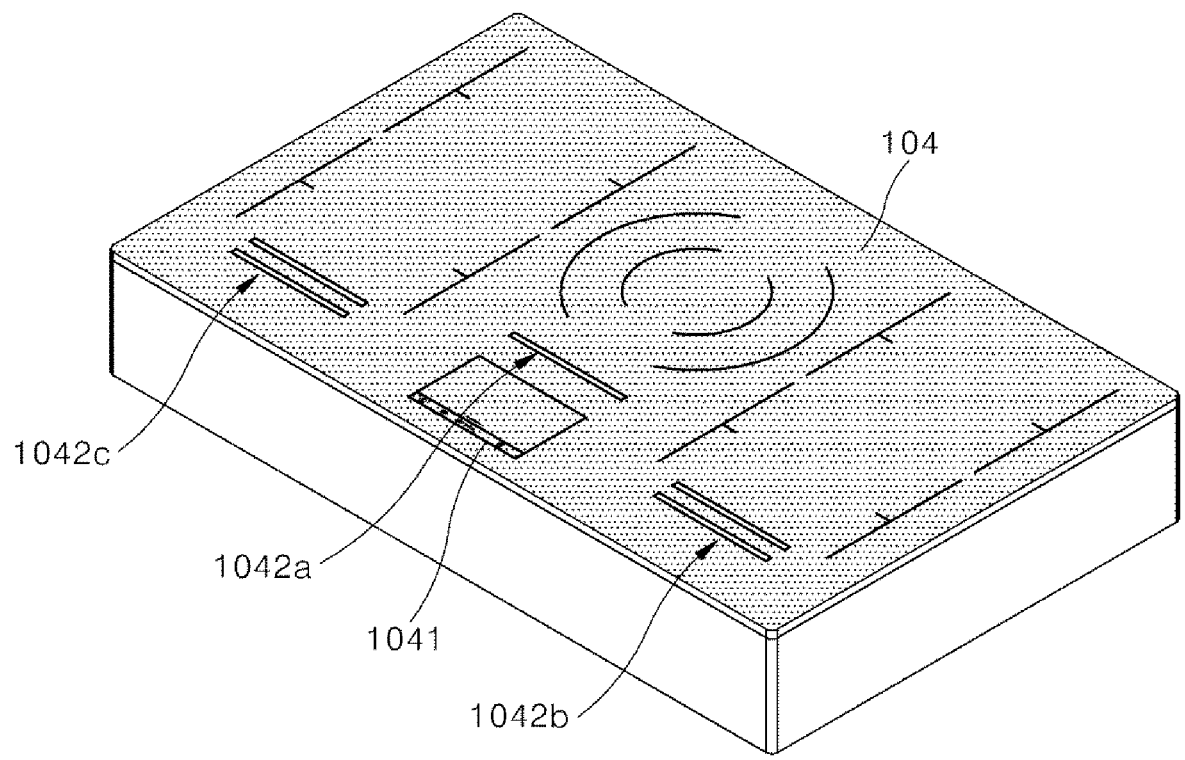
FIG. 2 is a perspective view of an induction heating device according to an embodiment.
Figure 3:
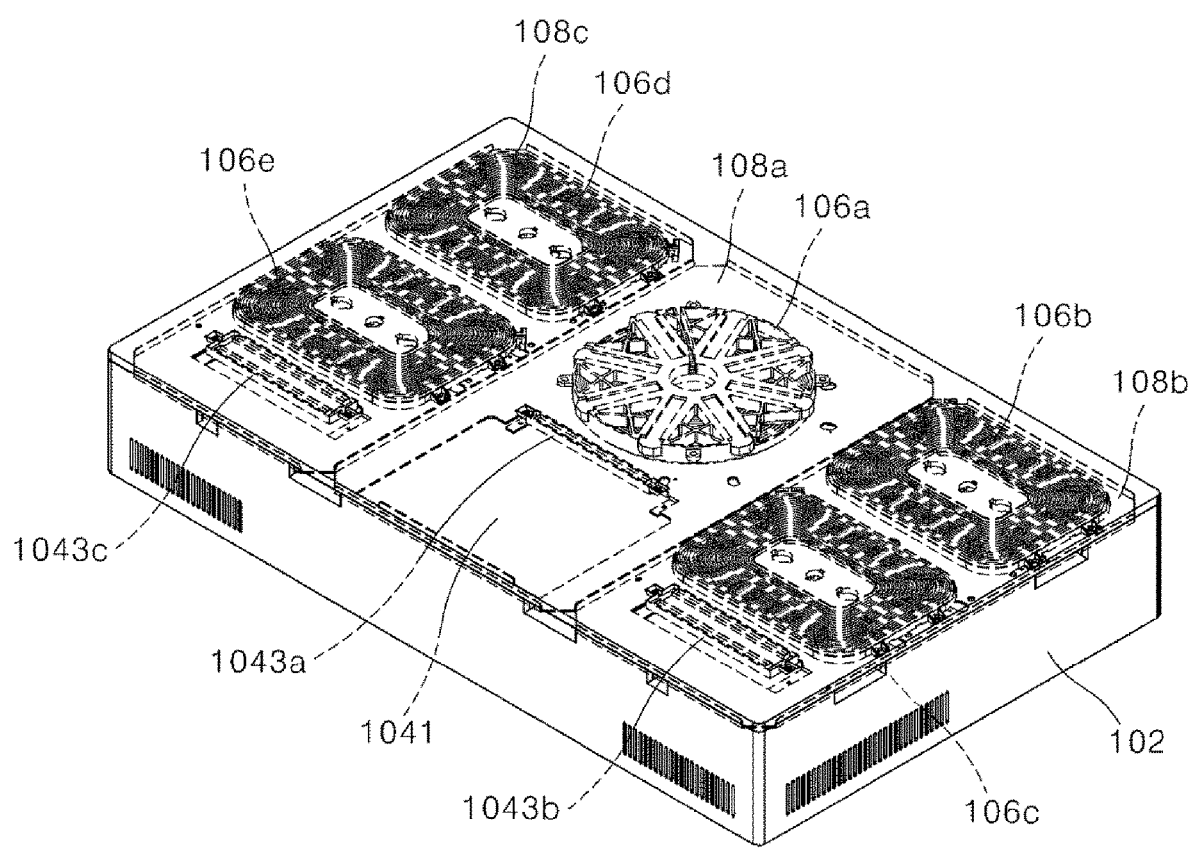
FIGS. 3 to 6 are perspective views of the induction heating device in FIG. 2 without some components.
Figure 4:
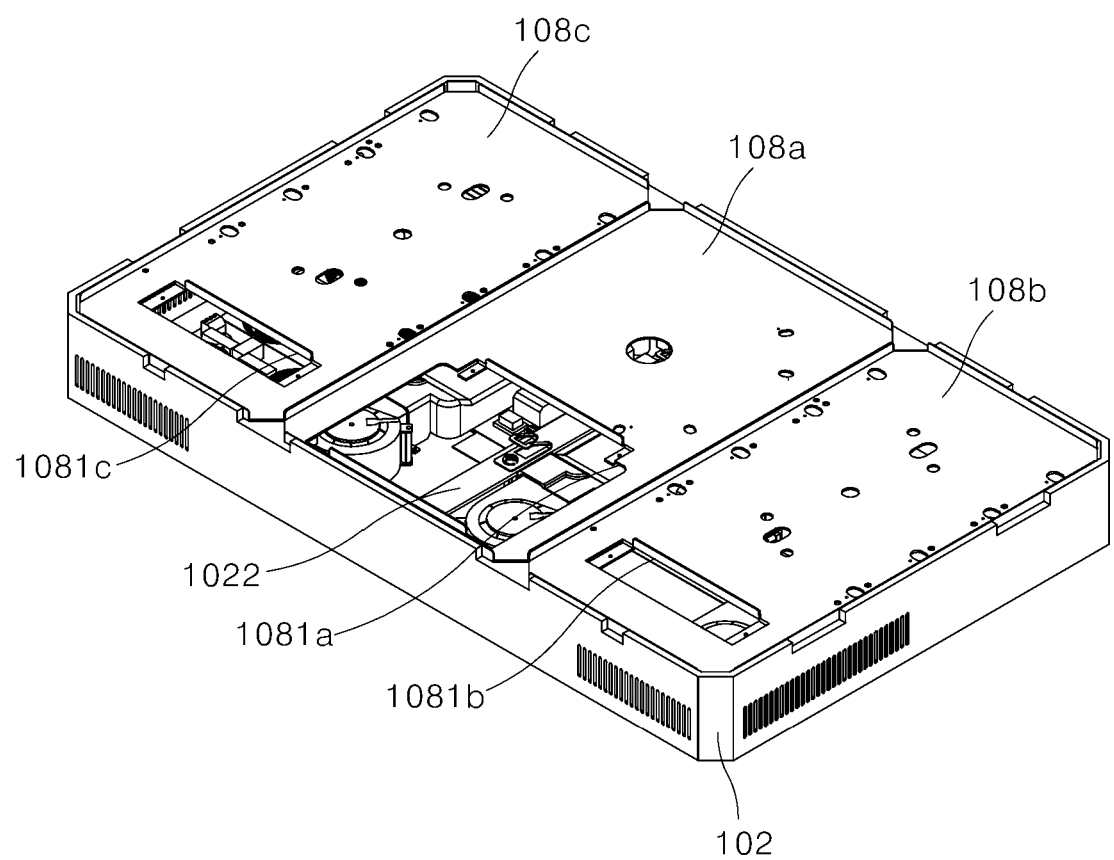
Figure 5:
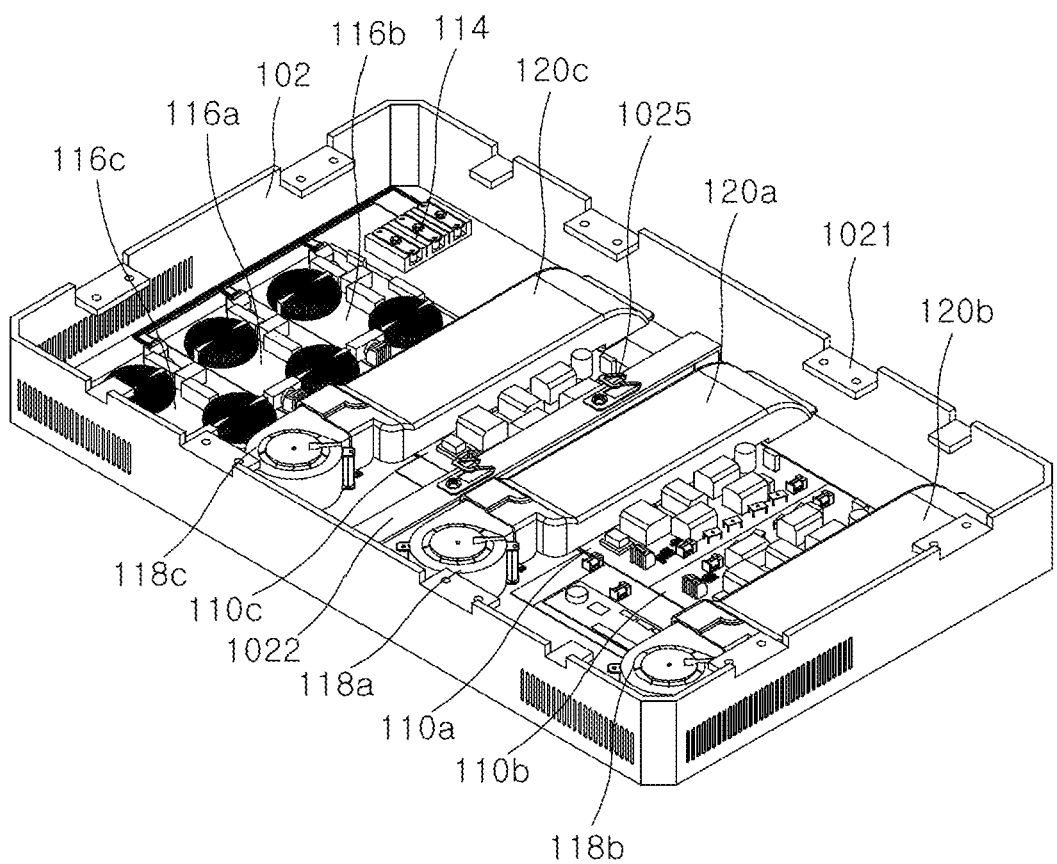
Figure 6:
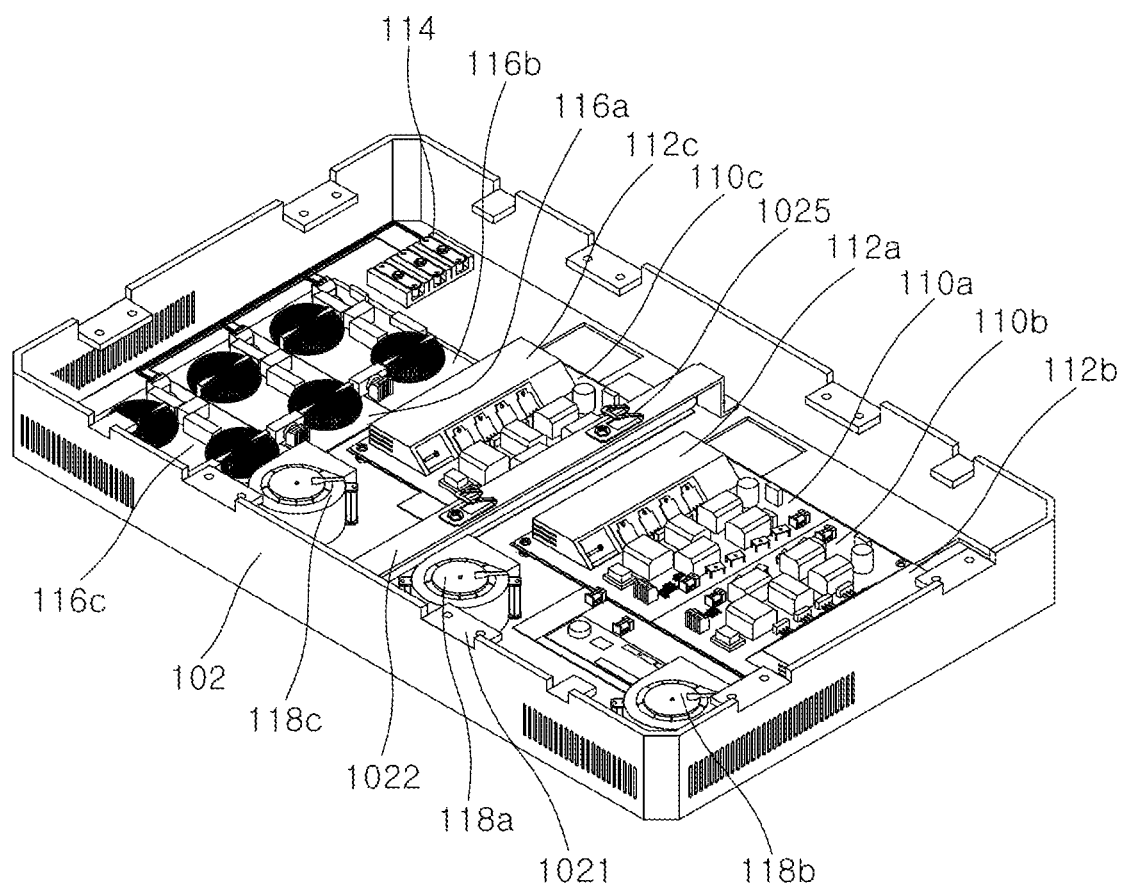

FIG. 2 is a perspective view of an induction heating device 100 according to an embodiment. FIGS. 3 to 6 are perspective views of the induction heating device 100 of FIG. 2 without some components. More specifically, FIG. 3 is a view showing the induction heating device 100 in FIG. 2 without cover plate 104, FIG. 4 is a view showing the induction heating device 100 in FIG. 2 without cover plate 104 and one or more working coil 106a, 106b, 106c, 106d, 106e, FIG. 5 is a view showing the induction heating device 100 in FIG. 2 without cover plate 104, one or more working coil 106a, 106b, 106c, 106d, 106e, and one or more base plate 108a, 108b, 108c, and FIG. 6 is a view showing the induction heating device 100 in FIG. 2 without cover plate 104, one or more working coil 106a, 106b, 106c, 106d, 106e, one or more base plate 108a, 108b, 108c, and one or more air guide 120a, 120b, 120c.

Referring to FIGS. 2 to 6, the induction heating device 100 according to an embodiment may include a case 102, cover plate 104, one or more working coil 106a, 106b, 106c, 106d, 106e, one or more base plate 108a, 108b, 108c, one or more drive circuit 110a, 110b, 110c, one or more heat sink 112a, 112b, 112c, a power feeder 114, one or more filter circuit 116a, 116b, 116c, one or more air blowing fan (fan) 118a, 118b, 118c, and one or more air guide 120a, 120b, 120c. The case 102 may protect components in the induction heating device 100. For example, the case 102 may be made of aluminum; however, embodiments are not limited thereto. The case 102 may be thermally insulated to prevent heat, generated by the one or more working coil 106a, 106b, 106c, 106d, 106e, from leaking outward.

The cover plate 104 may be coupled to an upper end of the case 102 to shield an inside of the case 102, and an object to be heated (not illustrated, an object to be heated by at least one of the one or more working coils 106a, 106b, 106c, 106d, 106e) may be placed on an upper surface of the cover plate 104.

An object to be heated, such as a cooking vessel, may be placed on the upper surface of the cover plate 104, and heat generated by the one or more working coil 106a, 106b, 106c, 106d, 106e may be delivered to the object to be heated through the upper surface of the cover plate 104. The cover plate 104 may be made of glass; however, embodiments are not limited thereto.

An input interface 1041 configured to receive an input from a user may be disposed on the upper surface of the cover plate 104. The input interface 1041 may be recessed into the upper surface of the cover plate 104 and may display a specific image. The input interface 1041 may receive a touch input from the user, and the induction heating device 100 may be driven based on the received touch input. The input interface 1041 might also include buttons or knobs located at the case 102 or outer housing of the induction heating device 100.

More specifically, the input interface 1041 may be a module for controlling the operation of the induction heating device 100, in particular, for inputting a heating intensity or a heating period, for example, desired by the user, and may be implemented as a physical button and/or a touch panel, for example. Additionally, the input interface 1041 may display a drive state or other information related to the operation of the induction heating device 100.

For example, the input interface 1041 may be a display, for example, a liquid crystal display (LCD) or an LED display; however, embodiments are not limited thereto.

One or more light display area 1042a, 1042b, 1042c may be formed on the upper surface of the cover plate 104. One or more light source unit (lighting unit) 1043a, 1043b, 1043c may be disposed below the cover plate 104, and light emitted from the one or more light source unit 1043a, 1043b, 1043c may be delivered to the user through the one or more light display area 1042a, 1042b, 1042c.

The one or more working coil 106a, 106b, 106c, 106d, 106e may be considered as a heating unit that heats an object to the heated, and may be disposed in the case 102. Each of the one or more working coils 106a, 106b, 106c, 106d, 106e may include a wire wound multiple times in a ring shape, and may generate an alternating current (AC) magnetic field. Additionally, a mica sheet and/or a ferrite core may be consecutively disposed on a lower side of the working coil 106a, 106b, 106c, 106d, 106e. The ferrite core may diffuse the AC magnetic field generated by the working coil 106a, 106b, 106c, 106d, 106e.

The ferrite core may be fixed to the mica sheet via a sealant. The mica sheet may be fixed to the working coil 106a, 106b, 106c, 106d, 106e and the ferrite core via a sealant. The mica sheet may prevent direct delivery of the heat, generated by the working coil 106a, 106b, 106c, 106d, 106e, to the ferrite core.

A plurality of working coils 106a, 106b, 106c, 106d, 106e may be provided. The plurality of working coils 106a, 106b, 106c, 106d, 106e may include first working coil 106a disposed in a central portion of the case 102, second working coil 106b and third working coil 106c disposed on a right (first) side of the first working coil 106a, and fourth working coil 106d and fifth working coil 106e disposed on a left (second) side of the first working coil 106a.

The second working coil 106b and the third working coil 106c may be disposed on the right side of the first working coil 106a in a frontward-rearward direction, and the fourth working coil 106d and the fifth working coil 106e may be disposed on the left side of the first working coil 106a in the frontward-rearward direction.

For example, the first working coil 106a may be a high-output dual heating coil. The second working coil 106b, the third working coil 106c, the fourth working coil 106d, and the fifth working coil 106e may be a single heating coil. The second working coil 106b, the third working coil 106c, the fourth working coil 106d, and the fifth working coil 106e may have a circle or oval form. In particular, the form may have straight portions connected with curved portions. Some or all of the single heating coils may have a same size. The first working coil 106a may have a circular form. The first working coil 106a as a dual heating coil has a heavy weight, and/or may have a maximum output of 7000 kW.

The induction heating device 100 according to an embodiment may perform the function of wireless power transmission based on configurations and features described above.

Technologies for wirelessly supplying power have been developed and have been used for a wide range of electronic devices. A battery of an electronic device, to which the wireless power transmitting technology is applied, can be charged only by being placed on a charge pad without connecting to an additional charge connector. Accordingly, the electronic device, to which the wireless power transmitting technology is applied, requires no cord or no charger, thereby ensuring improved mobility and a reduced size and weight.

The wireless power transmitting technology can be broadly classified as an electromagnetic induction technology using a coil, a resonance technology using resonance, and a radio emission technology for converting electric energy into microwaves and delivering the microwaves, for example. In the electromagnetic induction technology, power is transmitted using electromagnetic induction between a primary coil, that is, a working coil. included in an apparatus for wirelessly transmitting power and a secondary coil included in an apparatus for wirelessly receiving power.

The theory of the induction heating technology of the induction heating device 100 is substantially the same as that of the electromagnetic induction-based wireless power transmission technology, in that an object to be heated is heated using electromagnetic induction. Accordingly, the induction heating device 100 according to an embodiment may perform the function of wireless power transmission, as well as the function of induction heating.

The one or more base plate 108a, 108b, 108c may be disposed at an end of the case 102, and the plurality of working coils 106a, 106b, 106c, 106d, 106e may be disposed in an upper portion of the one or more base plate 108a, 108b, 108c. The one or more base plate 108a, 108b, 108c may support the plurality of working coils 106a, 106b, 106c, 106d, 106e which are heavy, and may help the plurality of working coils 106a, 106b, 106c, 106d, 106e to be mounted. The input interface 1041 and the one or more light source unit 1043a, 1043b, 1043c may be further disposed at the upper portion of the base plate 108a, 108b, 108c.

A plurality of base plates 108a, 108b, 108c may be provided; however, embodiments are not limited thereto. Alternatively, a single base plate may be disposed in the case 102.

The plurality of base plates 108a, 108b, 108c may include first base plate 108a, second base plate 108b, and third base plate 108c. The first base plate 108a, the second base plate 108b, and the third base plate 108c may be disposed at the middle of the case 102 side by side with each other.

The first base plate 108a may be disposed at a central portion of a middle of the case 102. The first working coil 106a may be disposed at an upper portion of the first base plate 108a.

One or more mounting portions 1021 may be provided at the case 102, which provide support for the base plates 108a, 108b, 108c. The one or more mounting portions 1021 may be bent inside of the case 102. Thus, the one or more base plates 108a, 108b, 108c may be placed thereon to provide an upper portion inside of the case 102 for accommodating the one or more working coils 106a, 106b, 106c, 106d, 106e and a lower portion for accommodating other components, such as one or more filter circuit 116a, 116b, 116c, one or more air blowing fan 118a, 118b, 118c, one or more air guide 120a, 120b, 120c, and one or more drive circuit 110a, 110b, 110c.

The input interface 1041, and first light source unit 1043a corresponding to the first working coil 106a may be further disposed in the upper portion of the first base plate 108a. The first base plate 108a may have a through hole 1081a to install the input interface 1041 and the first light source unit 1043a.

The second base plate 108b may be disposed on a right (first) side of the first base plate 108a at the end of the case 102. The second working coil 106b and the third working coil 106c may be disposed at an upper portion of the second base plate 108b.

A second light source unit 1043b corresponding to the second working coil 106b and the third working coil 106c may be further disposed in the upper portion of the second base plate 108b. In the upper portion of the second base plate 108b, the second working coil 106b, the third working coil 106c, and the second light source unit 1043b may be consecutively disposed. The second base plate 108b may have one or more through holes 1081b to install one or more second light source units 1043b.

The third base plate 108c may be disposed on a left (second) side of the first base plate 108a at the end of the case 102. The fourth working coil 106d and the fifth working coil 106e may be disposed at an upper portion of the third base plate 108c.

A third light source unit 1043c corresponding to the fourth working coil 106d and the fifth working coil 106e may be further disposed at the upper portion of the third base plate 108c. In the upper portion of the third base plate 108c, the fourth working coil 106d, the fifth working coil 106e, and the third light source unit 1043c may be consecutively disposed. The third base plate 108c may have one or more through holes 1081c to install the one or more third light source units 1043c.

The case 102 may have a plurality of mounting portions 1021 that mount the one or more base plates 108a, 108b, 108c at a portion of an outer circumferential surface of the case 102. That is, edges of the one or more base plates 108a, 108b, 108c may be mounted onto a top of the plurality of mounting portions 1021 bent inside of the case 102. Accordingly, the one or more base plates 108a, 108b, 108c may be disposed at a middle of the case 102. Thus, there is a space in the case 102 over and below the one or more base plates 108a, 108b, 108c. In the upper portions over the one or more base plates 108a, 108b, 108c, there are the working coils 106a, 106b, 106c, 106d, 106e and in the lower portion below the one or more base plates 108a, 108b, 108c there will be other components of the induction heating device 100.

The case 102 may include a bracket 1022 at a central portion of a lower end of the case 102. The bracket 1022 may be disposed at a central portion of a lower side or portion of the first base plate 108a, and may prevent sagging of a lower surface of the first base plate 108a, caused by a weight of the first base plate 108a. The weight of the first base plate 108a may include a weight of the first working coil 106a in the upper portion of the first base plate 108a.

The bracket 1022 may include at least one elastic element 1025 on a top of the bracket 1022 facing the lower surface of the base plate 108a, 108b, 108c. For example, the elastic element 1025 may be a leaf spring. An upper end of at least one elastic element 1025 may contact the lower surface of the first base plate 108a, and may prevent sagging of the lower surface of the first base plate 108a. Further, it will keep the long side portions of the case 102 together.

The drive circuits 110a, 110b, 110c may control driving of the plurality of working coils 106a, 106b, 106c, 106d, 106e, which are heating units, and may further control driving of components, such as an input interface 1041, for example, of the induction heating device 100. The drive circuits 110a, 110b, 110c may include various components in relation to the driving of the working coils 106a, 106b, 106c, 106d, 106e. The components may include a power supply configured to supply AC power, a rectifier configured to rectify AC power of the power supply into direct current (DC) power, an inverter configured to convert DC power, rectified by the rectifier, into resonance current as a result of a switching operation and supply the resonance current to the working coil 106, a microcomputer, for example, a micom, configured to control the inverter and components in relation to driving of the inverter, and a relay or a semiconductor switch configured to turn on or turn off the working coils 106a, 106b, 106c, 106d, 106e, for example.

The one or more drive circuit 110a, 110b, 110c may include first drive circuit 110a, second drive circuit 110b, and third drive circuit 110c. The first drive circuit 110a may be disposed on a right (first) side of the lower end of the case 102 with respect to the bracket 210 and may control driving of the first working coil 106a. The second drive circuit 110b may be disposed on a right (first) side of the first drive circuit 110a and may control driving of the second working coil 106b and the third working coil 106c. The third drive circuit 110c may be disposed on a left (second) side of the lower end of the case 102 with respect to the bracket 210 and may control driving of the fourth working coil 106d and the fifth working coil 106e.

The one or more heat sink 112a, 112b, 112c may be disposed over portions of the drive circuits 110a, 110b, 110c and may prevent an increase in temperature of components disposed at the portions of the drive circuits 110a, 110b, 110c. The one or more heat sink 112a, 112b, 112c may include first heat sink 112a, second heat sink 112b, and third heat sink 112c. The first heat sink 112a may prevent an increase in temperature of components installed at the first drive circuit 110a, the second heat sink 112b may prevent an increase in temperature of components installed at the second drive circuit 110b, and the third heat sink 112c may prevent an increase in temperatures of components installed at the third drive circuit 110c.

The power feeder 114 may supply an external power source to the induction heating device 100. The power feeder 114 may be implemented as a terminal block, for example.

The power feeder 114 may be disposed at any one of edges of the lower end of the case 102. For example, the power feeder 114 may be disposed at an upper end of the left side of the lower end of the case 102. The power feeder 114 may be located at a same side portion of the case 102 as the filter circuits 116a, 116b, 116c.

The one or more filter circuit 116a, 116b, 116c may be disposed at any one of the edges of the lower end of the case 102, and may reduce noise made by the plurality of working coils 106a, 106b, 106c, 106d, 106e. The one or more filter circuit 116a, 116b, 116c may include first filter circuit 116a, second filter circuit 116b, and third filter circuit 116c.

The first filter circuit 116a may reduce noise made by the first working coil 106a. The second filter circuit 116b may reduce noise made by the second working coil 106b and the third working coil 106c. The third filter circuit 116c may reduce noise made by the fourth working coil 106d and the fifth working coil 106e.

The one or more air blowing fan 118a, 118b, 118c may help to reduce or decrease a temperature inside of the case 102. Accordingly, the one or more air blowing fan 118a, 118b, 118c may lower a temperature of various components installed in or on the one or more drive circuits 110a, 110b, 110c.

The one or more air blowing fan 118a, 118b, 118c may be disposed at a lower side of the one or more working coil 106a, 106b, 106c, 106d, 106e. Thus, the one or more air blowing fan 118a, 118b, 118c may be disposed below the one or more base plates 108a, 108b, 108c.

The one or more air blowing fan 118a, 118b, 118c may include first air blowing fan 118a, second air blowing fan 118b, and third blow fan 118c. The first air blowing fan 118a may cool various components installed in or on the first drive circuit 110a and may further cool the first light source unit 1043a and the input interface 1041. More particularly, the first air blowing fan 118a may deliver air (wind) for cooking to the first heat sink 112a in or at an upper portion of the first drive circuit 110a.

The second air blowing fan 118b may cool various components installed in or on the second drive circuit 110b and may further cool the second light source unit 1043b. More particularly, the second air blowing fan 118b may deliver air for cooling to the second heat sink 112b in or at an upper portion of the second drive circuit 110b.

The third air blowing fan 118c may cool various components installed in or on the third drive circuit 110c and may further cool the third light source unit 1043c. More particularly, the third air blowing fan 118c may deliver air for cooling to the third heat sink 112c in or at an upper portion of the third drive circuit 110c.

The one or more air blowing fan 118a, 118b, 118c may not include structure to prevent foreign substances from contacting the one or more air blowing fans 118a, 118b, 118c. The one or more air guide 120a, 120b, 120c may guide air generated by the one or more air blowing fan 118a, 118b, 118c. The one or more light source unit 1043a, 1043b, 1043c, the input interface 1041, and the one or more air blowing fan 118a, 118b, 118c may be disposed on the lower side of the one or more working coil 106a, 106b, 106c, 106d, 106e, and the one or more air guide 120a, 120b, 120c may guide air, output from the one or more air blowing fan 118a, 118b, 118c on a lower side of the case 102, toward an upper side of the case 102.

The air guide 120a, 120b, 120c may include first air guide 120a, second air guide 120b, and third guide 120c. The first air guide 120a may be disposed to encircle the first heat sink 112a installed at the first drive circuit 110a and may guide (deliver) air, output from the first air blowing fan 118a, to the first heat sink 112a. The second air guide 120b may be disposed to encircle the second heat sink 112b installed at the second drive circuit 110b and may guide air, output from the second air blowing fan 118b, to the second heat sink 112b. The third air guide 120c may be disposed to encircle the third heat sink 112c installed at the third drive circuit 110c and may guide air, output from the third air blowing fan 118c, to the third heat sink 112c.

The induction heating device 100 according to an embodiment has configurations and features described above. Hereinafter, a shape of the one or more air guide 120a, 120b, 120c, and a configuration for preventing air, output from the one or more air blowing fan 118a, 118b, 118c, from escaping out of the one or more air guide 120a, 120b, 120c are described.

Figure 7:
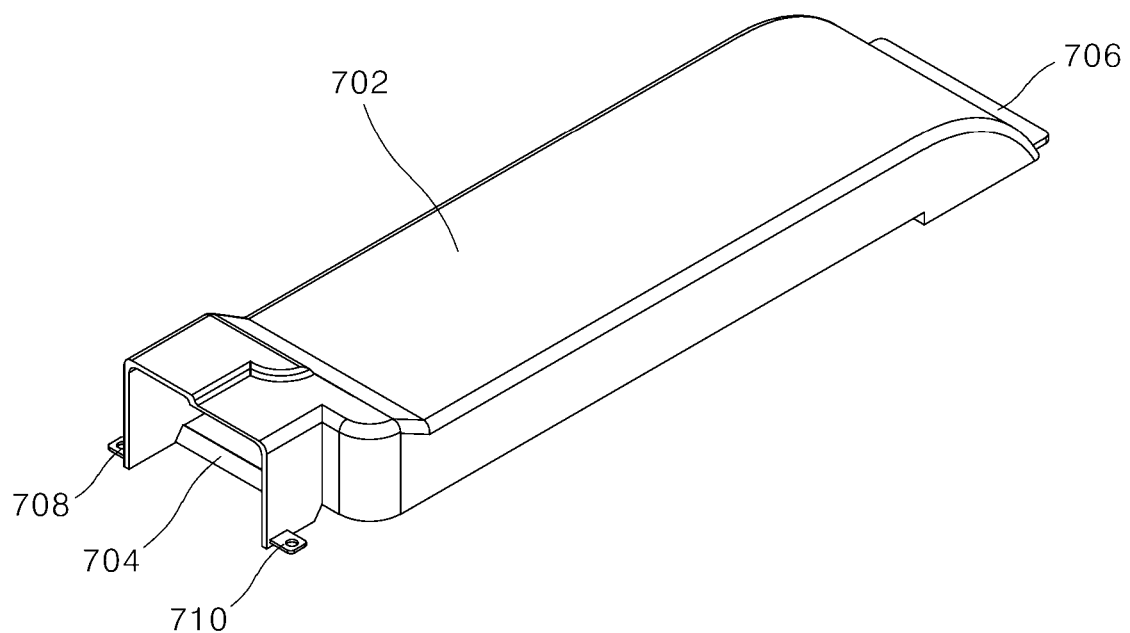
FIG. 7 is a front perspective view of an air guide according to an embodiment.
Figure 8:
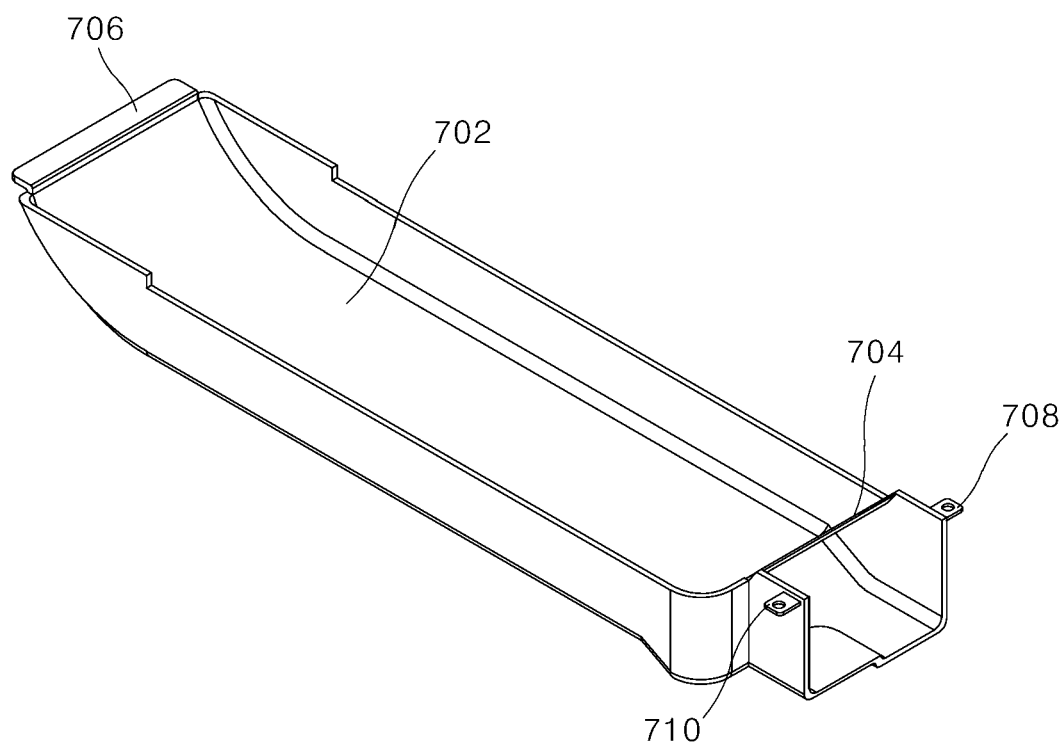
FIG. 8 is a rear perspective view of an air guide according to an embodiment.
Figure 9:
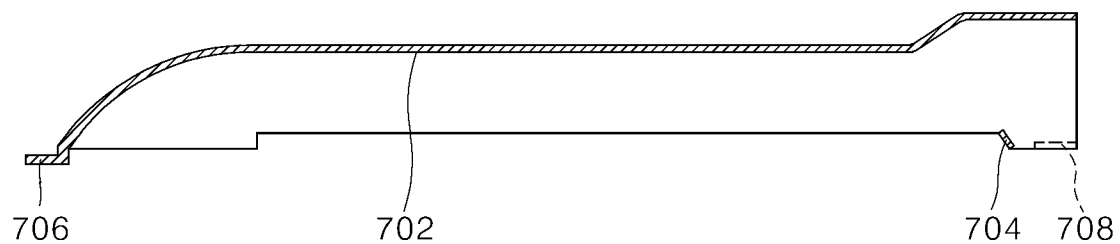
FIG. 9 is a lateral cross-sectional view of an air guide according to an embodiment.
Figure 10:
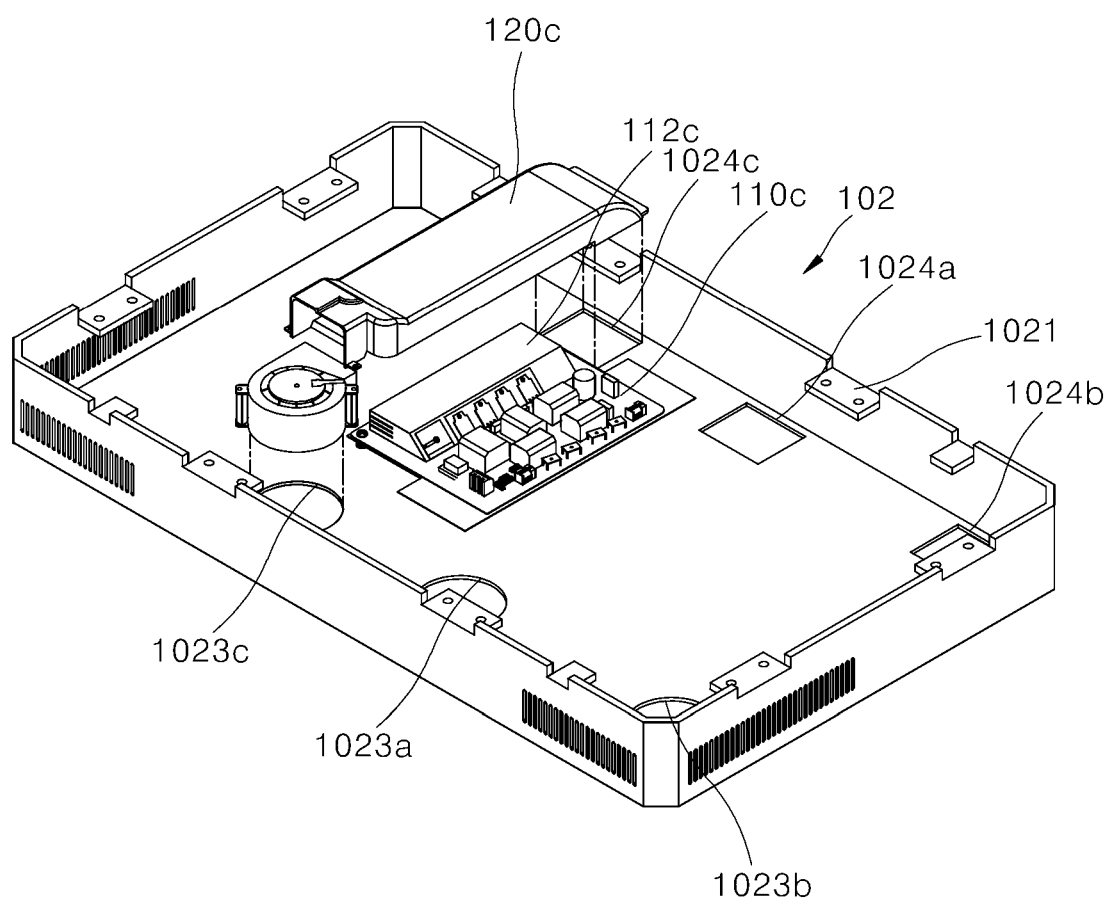
FIG. 10 is a view of an air blowing fan and an air guide disposed in a case, according to an embodiment.
Figure 11:
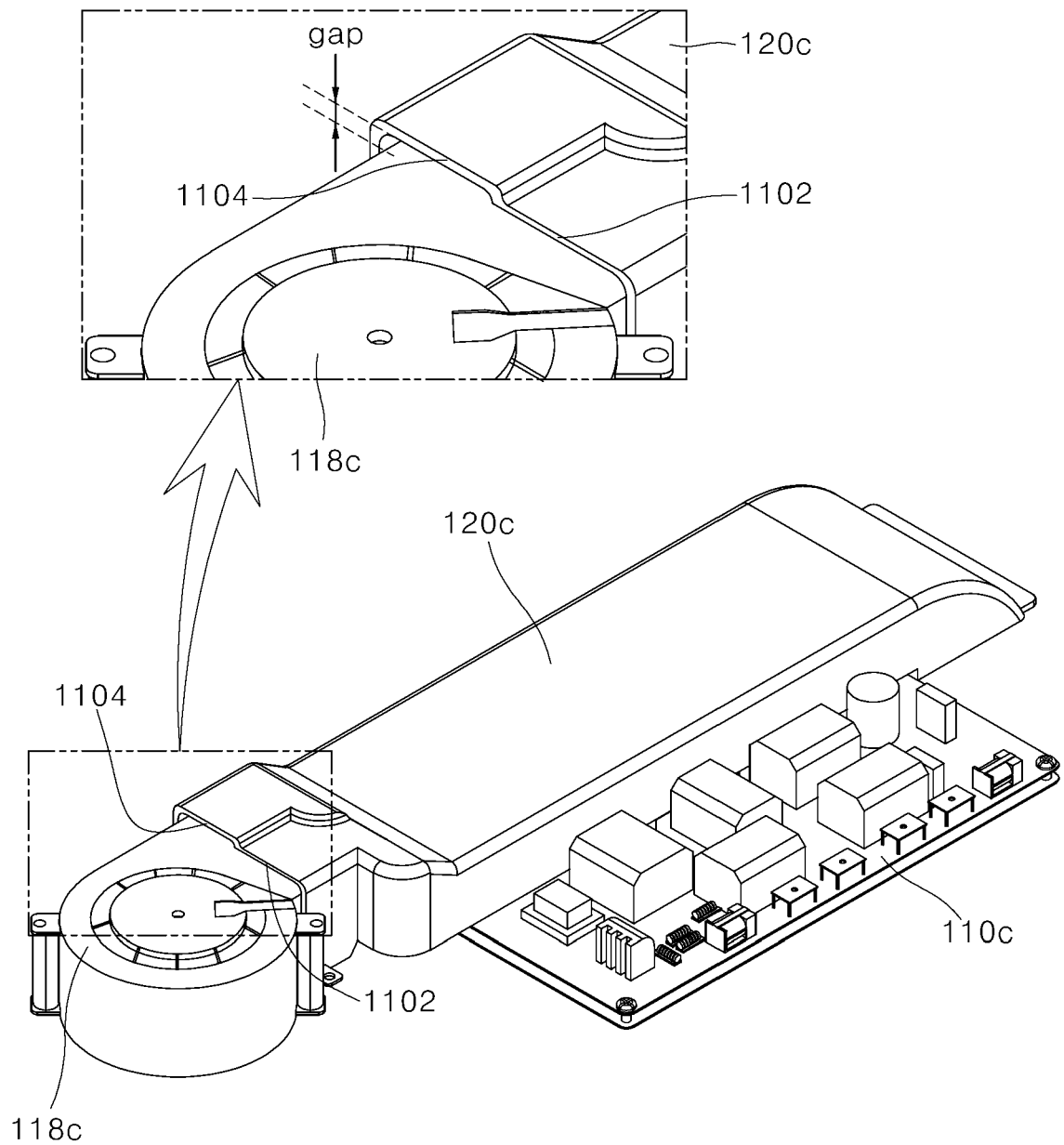
FIG. 11 is a perspective view showing an air blowing fan and an air guide connected, according to an embodiment.
Figure 12:
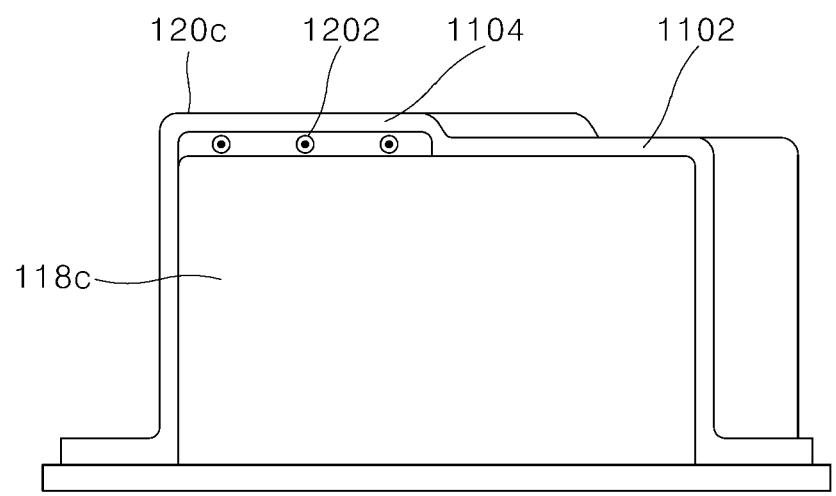
FIG. 12 is a front cross-sectional view of an air blowing fan and an air guide, according to an embodiment.
Figure 13:
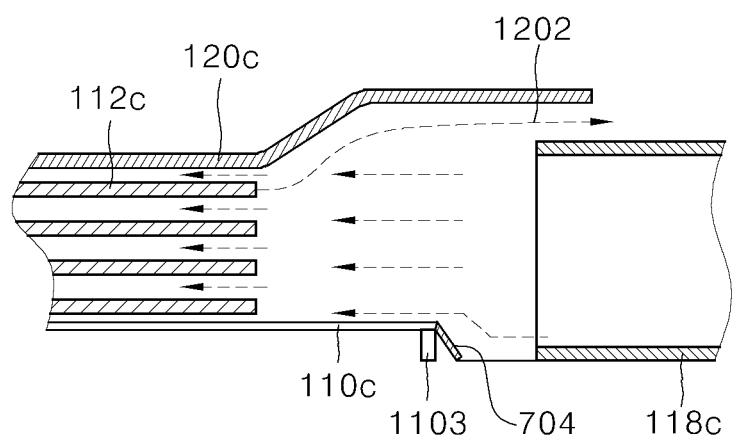
FIG. 13 is a view describing a concept in which air output from an air blowing fan flows into an air guide, according to an embodiment.
Figure 14:
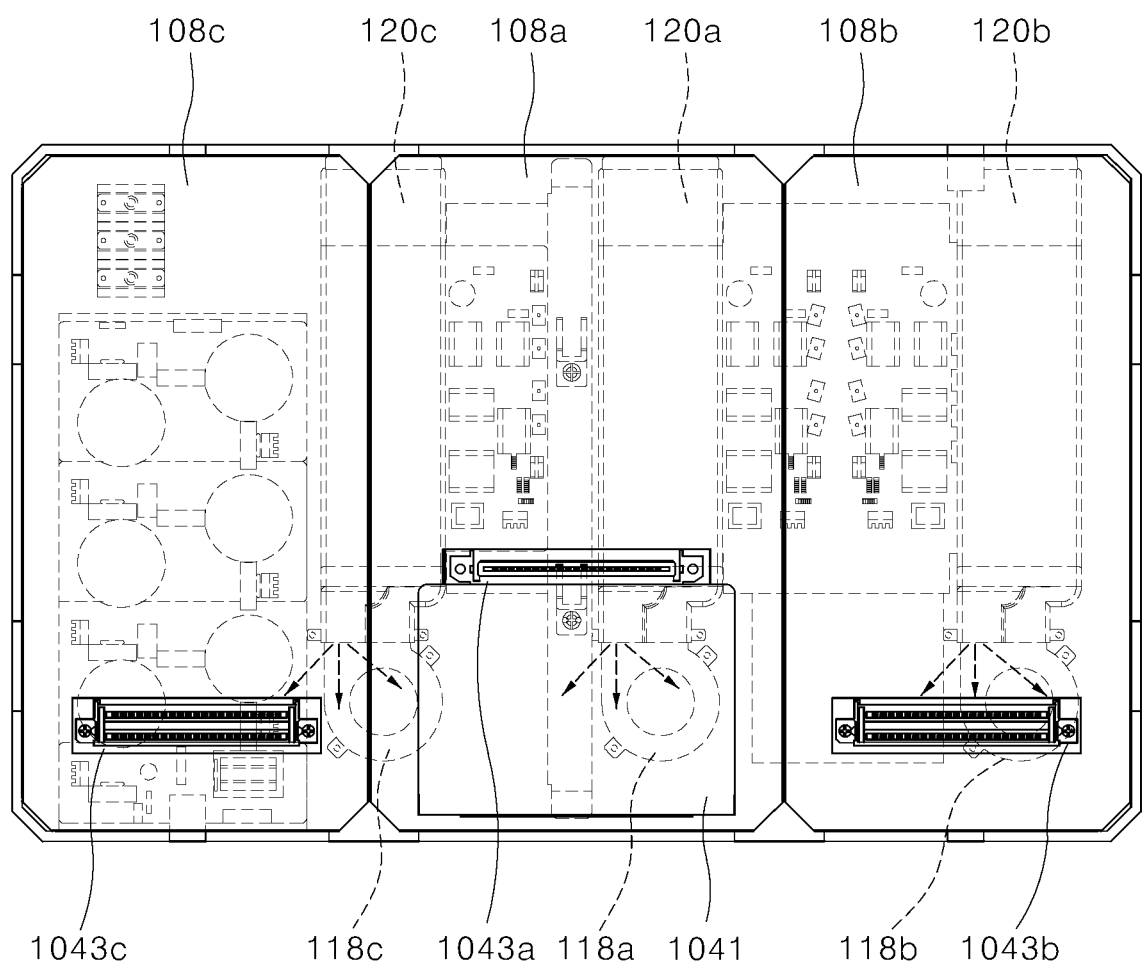
FIG. 14 is a view showing air discharged from an air guide, according to an embodiment.
Figure 15:
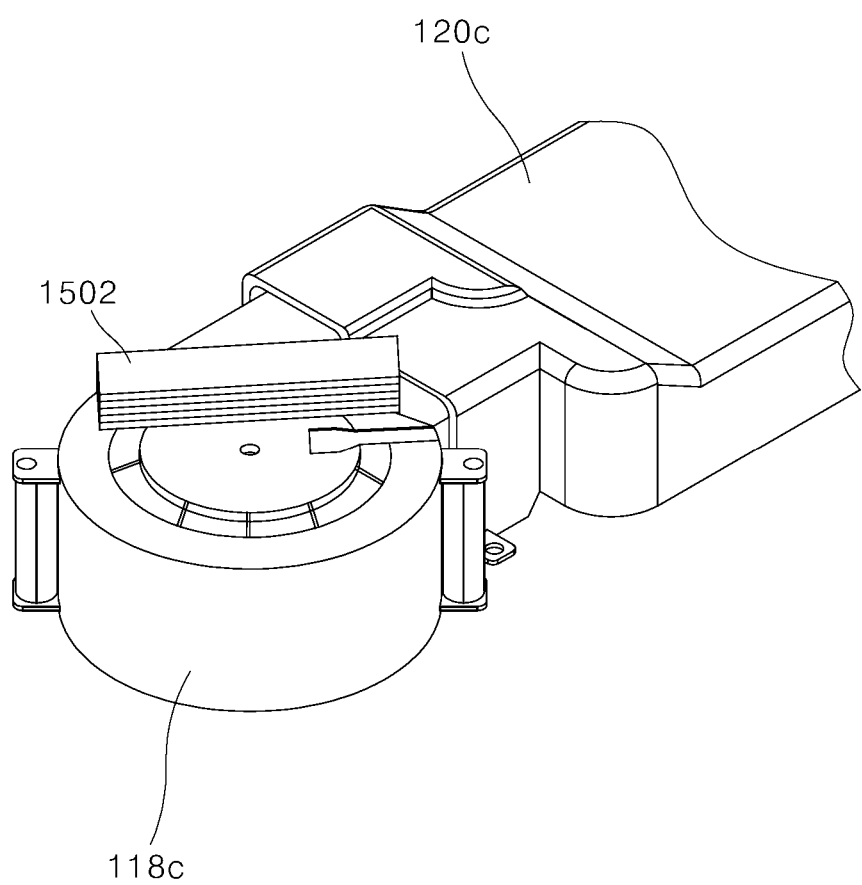
FIG. 15 is a view of a damper member disposed on an upper surface of an air blowing fan, according to an embodiment.
Figure 16:
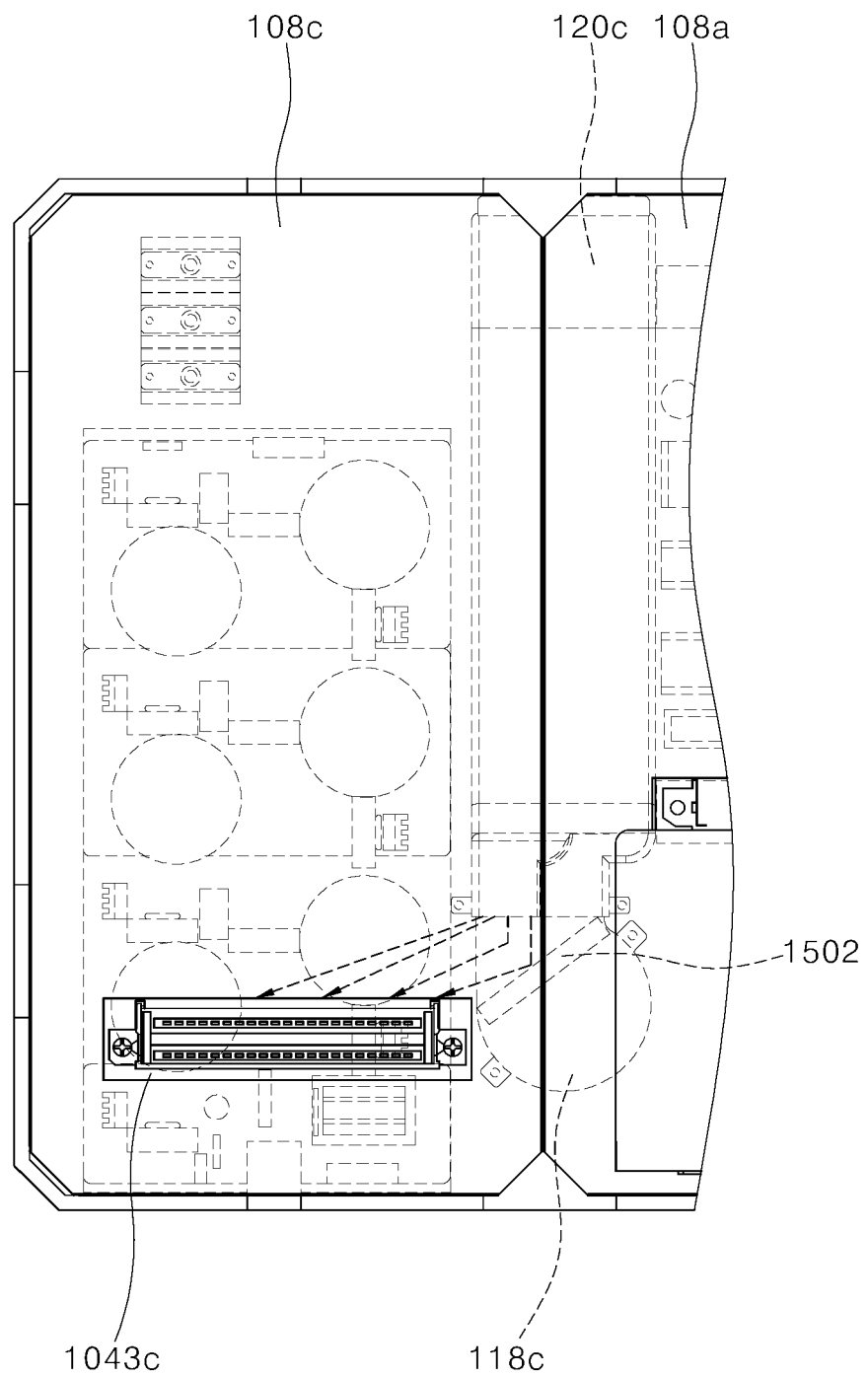
FIG. 16 is a view describing a concept in which a direction of air discharged from an air guide is changed through a damper member, according to an embodiment.

FIG. 7 is a front perspective view of an air guide 120a, 120b, 120c according to an embodiment. FIG. 8 is a rear perspective view of an air guide 120a, 120b, 120c according to an embodiment. FIG. 9 is a lateral cross-sectional view of an air guide 120a, 120b, 120c according to an embodiment. FIG. 10 is a view of an air blowing fan 118a, 118b, 118c and an air guide 120a, 120b, 120c disposed in case 102, according to an embodiment. FIG. 11 is a perspective view showing an air blowing fan 118a, 118b, 118c and an air guide 120a, 120b, 120c connected, according to an embodiment. FIG. 12 is a front cross-sectional view of an air blowing fan 118a, 118b, 118c and an air guide 120a, 120b, 120c, according to an embodiment. FIG. 13 is a view describing a concept in which air output from an air blowing fan 118a, 118b, 118c flows into an air guide 120a, 120b, 120c, according to an embodiment. FIG. 14 is a view showing air discharged from an air guide 120a, 120b, 120c, according to an embodiment. FIG. 15 is a view of a damper member 1502 disposed on an upper surface of an air blowing fan 118a, 118b, 118c, according to an embodiment. FIG. 16 is a view describing a concept in which a direction of air discharged from an air guide 120a, 120b, 120c is changed through a damper member 1502, according to an embodiment. For convenience of description, FIGS. 10 to 13 show only one way in which third air guide 120c is disposed over third drive circuit 110c in case 102.

Referring to FIG. 10, one or more first through hole 1023a, 1023b, 1023c and one or more second through hole 1024a, 1024b, 1024c may be formed at the lower end of the case 102. The case 102 may have a shape in which the lower end of the case 102 is closed except for the one or more first through hole 1023a, 1023b, 1023c and the one or more second through hole 1024a, 1024b, 1024c.

The one or more first through hole 1023a, 1023b, 1023c may serve as a passage through which air is supplied to the one or more air blowing fan 118a, 118b, 118c. The one or more first through hole 1023a, 1023b, 1023c may be formed on the lower surface of the case 102 near lower ends of the one or more air blowing fan 118a, 118b, 118c. Accordingly, air may be supplied to the one or more air blowing fans 118a, 118b, 118c.

The one or more first through hole 1023a, 1023b, 1023c may be formed at an edge of the lower side of the case 102. A number of the one or more first through hole 1023a, 1023b, 1023c may be the same as that of the one or more air blowing fan 118a, 118b, 118c. That is, (1-1)th through hole 1023a may provide a passage through which air may be supplied to the first air blowing fan 118a, (1-2)th through hole 1023b may provide a passage through which air may be supplied to the second air blowing fan 118b, and (1-3)th through hole 1023c may provide a passage through which air may be supplied to the third air blowing fan 118c. The (1-1)th through hole 1023a, (1-2)th through hole 1023b, and (1-3)th through hole 1023c may be disposed side by side at the edge of the lower side.

The one or more first through hole 1023a, 1023b, 1023c may have a shape corresponding to a shape of a lower surface of the one or more air blowing fan 118a, 118b, 118c. That is, the shape of the one or more first through hole 1023a, 1023b, 1023c may be the same as a shape of a fan in the one or more air blowing fan 118a, 118b, 118c; however, embodiments are not limited thereto.

The one or more second through hole 1024a, 1024b, 1024c may serve as a passage through which air output from the one or more air blowing fan 118a, 118b, 118c may be discharged out of the case 102. That is, air in the case 102 may be discharged outward through the second through hole 1024a, 1024b, 1024c.

One or more air guide 120a, 120b, 120c configured to guide air generated by the one or more air blowing fan 118a, 118b, 118c may be disposed at the lower end of the case 102. One (first) end of the one or more air guide 120a, 120b, 120c may be disposed near the one or more air blowing fan 118a, 118b, 118c, and the other (second) end of the one or more air guide 120a, 120b, 120c may contact and connect to the lower surface of the case 102.

The one or more second through hole 1024a, 1024b, 1024c may be formed on an edge of the upper side of the case 102. The one or more second through hole 1024a, 1024b, 1024c may be connected to the other end of the air guide 120a, 120b, 120c, and accordingly, air may be discharged out of the case 102.

The one or more second through hole 1024a, 1024b, 1024c may have a shape corresponding to a shape of the other end of the one or more air guide 120a, 120b, 120c. That is, the shape of the one or more second through hole 1024a, 1024b, 1024c may be the same as that of the other end of the one or more air guide 120a, 120b, 120c.

A number of the one or more second through hole 1024a, 1024b, 1024c may be the same as that of the one or more air guide 120a, 120b, 120c. (2-1)th through hole 1024a may connect to the first air guide 120a and provide a passage through which air may be discharged, (2-2)th through hole 1024b may connect to the second air guide 120b and provide a passage through which air may be discharged, and (2-3)th through hole 1024c may connect to the third air guide 120a and provide a passage through which air may be discharged. The (2-1)th through hole 1024a, (2-2)th through hole 1024b, and (2-3)th through hole 1024c may be disposed side by side at the edge of the upper side of the case 102.

Referring to FIG. 4 and FIGS. 7 to 12, the one or more air guide 120a, 120b, 120c may include a housing 702, a first member 704, a first connecting portion 706, a second connecting portion 708, and a third connecting portion 710. The one or more air guide 120a, 120b, 120c may be integrally formed through single processing.

The housing 702 may form a body of the one or more air guide 120a, 120b, 120c. The housing 702 may have a hollow inside. The housing 702 may be made of a plastic material; however, embodiments are not limited thereto.

The housing 702 may have one (first) end, a middle end, and the other (second) end. The one end of the housing 702 may be disposed near the one or more air blowing fan 118a, 118b, 118c disposed on the lower side of the case 102. Air output from the one or more air blowing fan 118a, 118b, 118c may be supplied to the one end of the one or more air guide 120a, 120b, 120c. For example, a part or portion of the one end of the housing 702 may overlap a part or portion of an output end of the one or more air blowing fan 118a, 118b, 118c.

Referring to FIG. 9, the one end of the housing 702 may have a rectangular shape, in a lateral cross-sectional view. Referring to FIGS. 11 and 12, a height of at least a part or portion of an upper surface of the one end of the housing 702 may be greater than a height of the one or more air blowing fan 118a, 118b, 118c.

More specifically, the upper surface of the one end of the housing 702 may include a first portion 1102 and a second portion 1104. The first portion 1102 and the second portion 1104 of the one end of the housing 702 may be connected to each other. For example, the first portion 1102 of the one end of the housing 702 may be a right portion of the upper surface of the one end of the housing 702, and the second portion 1104 of the one end of the housing 702 may be a left portion of the upper surface of the one end of the housing 702.

The first portion (the right portion) 1102 of the one end of the housing 702 may be disposed in contact with an upper surface of the one or more air blowing fan 118a, 118b, 118c. That is, the first portion 1102 of the one end of the housing 702 may be mounted onto the upper surface of the one or more air blowing fan 118a, 118b, 118c.

A height of the second portion (the left portion) 1104 of the one end of the housing 702 may be greater than the height of the upper surface of the one or more air blowing fan 118a, 118b, 118c. In this case, a gap may be formed between the second portion 1104 of the one end of the housing 702 and the upper surface of the one or more air blowing fan 118a, 118b, 118c. Some of the air 1202 output from the one or more air blowing fan 118a, 118b, 118c may be discharged through the gap.

That is, most of the air output from the one or more air blowing fan 118a, 118b, 118c may be delivered to a part or portion, that is, a portion where the heat sink 112a, 112b, 112c is disposed, of the one or more drive circuit 110a, 110b, 110c through the one or more air guide 120a, 120b, 120c, and some of the air 1202 output from the one or more air blowing fan 118a, 118b, 118c may be discharged through the gap in a direction opposite to a direction in which most of the air is discharged.

The air 1202, discharged through the gap formed in the second portion 1104 of the one end of the housing 702, may be delivered to the one or more light source unit 1043a, 1043b, 1043c and the input interface 1041 in a concentrated manner. Based on the discharged air 1202, the one or more light source unit 1043a, 1043b, 1043c and the input interface 1041 may be cooled.

The first member 704 may be formed at the one end of the housing 702. The first member 704 may prevent the air, output from the one or more air blowing fan 118a, 118b, 118c, from flowing into a space between the lower surface of the case 102 and the one or more drive circuit 110a, 110b, 110c.

The one or more drive circuit 110a, 110b, 110c may be spaced a first predetermined distance apart from the lower surface of the case 102 for reasons of insulation, for example. That is, the case 102 may have a boss 1103, protruding upward from the lower surface of the case 102, on the lower surface thereof, and the one or more drive circuit 110a, 110b, 110c may be disposed on the boss 1102. The one or more air blowing fan 118a, 118b, 118c may be disposed in contact with the lower surface of the case 102. In this case, the first member 704 formed at a lower end of the one end of the one or more air guide 120a, 120b, 120c may prevent the air, output from the one or more air blowing fan 118a, 118b, 118c, from flowing into a space between the lower surface of the case 102 and the one or more drive circuit 110a, 110b, 110c.

A middle of the housing 702 may be disposed such that it encircles a part or portion of the one or more drive circuit 118a, 118b, 118c. That is, the one or more heat sink 112a, 112b, 112c may be disposed over a part or portion of the one or more drive circuit 118a, 118b, 118c, and may be disposed inside of the middle of the housing 702. Both sides of the middle of the housing 702 may be disposed in contact with an upper surface of the one or more drive circuit 118a, 118b, 118c. The one or more heat sink 112a, 112b, 112c may be cooled based on air flowing at the middle of the housing 702. More particularly, both sides of the middle of the one or more air guide 120a, 120b, 120c may be disposed in contact with the upper surface of the one or more drive circuit 110a, 110b, 110c. Accordingly, air may be prevented from leaking outward from between the middle of the one or more air guide 120a, 120b, 120c and the upper surface of the one or more drive circuit 110a, 110b, 110c.

Referring to FIG. 9, the first portion 1102 at the one end of the middle of the housing 702 may have a pentagonal shape, and the remaining portion of the middle of the housing 702 may have a rectangular shape, in the lateral cross-sectional view. One end of the first portion 1102 of the middle end of the housing 702 may connect to the one end of the housing 702, and the other end of the first portion 1102 of the middle of the housing 702 may connect to the remaining portion of the middle of the housing 702.

The other end of the housing 702 may be disposed in contact with the lower surface of the case 102. That is, the other end of the housing 702 may connect to the one or more second through hole 1024a, 1024b, 1024c. Air, output from the one or more air blowing fan 118a, 118b, 118c and passing through a part or portion of the one or more drive circuit 118a, 118b, 118c, may be output from the other end of the housing 702.

Referring to FIG. 9, a shape of the other end of the housing 702 may correspond to a circular sector shape having a central angle of 90°, in the lateral cross-sectional view.

A first connecting portion 706 for connection with the lower surface of the case 102, that is, the one or more second through hole 1024a, 1024b, 1024c, may be formed at an end of the other end of the housing 702. In this case, the first connecting portion 706 may protrude to an outside of the one or more second through hole 1024a, 1024b, 1024c such that the one or more second through hole 1024a, 1024b, 1024c and the other end of the housing 702 may be connected.

The second connecting portion 708 and the third connecting portion 710 may be formed at the one end of the housing 702. The second connecting portion 708 and the third connecting portion 710 may be formed on both sides of the one end of the housing 702, and may have a coupling hole to couple the housing 702 to the lower surface of the case 102. For example, the second connecting portion 708 and the third connecting portion 710 may be screw-coupled to the lower surface of the case 102.

Hereinafter, description is provided with reference to FIGS. 12 to 14. For convenience of description, FIG. 12 and FIG. 13 show third air guide 120c and third air blowing fan 118c only.

Most of the air output from the one or more air blowing fan 118a, 118b, 118c may be delivered to a part or portion, that is, the one or more heat sink 112a, 112b, 112c, of the drive circuit 118a, 118b, 118c through the one or more air guide 120a, 120b, 120c. The one or more heat sink 112a, 112b, 112c may be cooled by most of the air, described above, in a concentrated manner.

A height of the second portion 1104 of the one end of the one or more air guide 120a, 120b, 120c may be greater than the height of the upper surface of the one or more air blowing fan 118a, 118b, 118c. Accordingly, the gap may be formed in the second portion 1104. In this case, some 1202 of the air output from the one or more air blowing fan 118a, 118b, 118c may collides with the one end of the one or more heat sink 112a, 112b, 112c to escape out of the one or more air guide 120a, 120b, 120c. Or, some 1202 of the air output from the one or more air blowing fan 118a, 118b, 118c may escape by inner pressure between the one end of the one or more air guide 120a, 120b, 120c and the one or more air blowing fan 118a, 118b, 118c. That is, some 1202 of the air may be discharged through the gap formed in the second portion 1104 in a direction opposite to a direction in which most of the air, described above, is delivered. Some 1202 of the air, discharged through the gap, may be delivered to a display unit, such as the one or more light source unit 1043a, 1043b, 1043c, and the input interface 1041, for example, and may cool the display unit.

More particularly, speed of air delivered through a narrow passage may be higher than that of air delivered through a wide passage (Bernoulli's principle). Accordingly, in the induction heating device 100 according to embodiments disclosed herein, by forming the one end of the one or more air guides 120a, 120b, 120c into the first portion 1102 and the second portion 1104, an area of the space in which some 1202 of the air is discharged is reduced. Accordingly, the speed at which some 1202 of the air is discharged is increased.

That is, the one end of the one or more air guide 120a, 120b, 120c may have a shape in which the first portion 1102 contacting the one or more air blowing fan 118a, 118b, 118c, and the second portion 1104 spaced from the one or more air blowing fan 118a, 118b, 118c connect to each other. In this case, air may not be discharged through the first portion 1102, and some 1202 of the air may be discharged only through the second portion 1104. Accordingly, the speed of some 1202 of the air discharged may increase and some 1202 of the air may be delivered to the display unit in a concentrated manner.

A flow of delivery of some 1202 of the air discharged to the display unit is specifically described, hereinafter.

The one or more light source unit 1043a, 1043b, 1043c and the input interface 1041 may be disposed over the one or more air blowing fan 118a, 118b, 118c or in an adjacent area over the one or more air blowing fan 118a, 118b, 118c. More specifically, the first light source unit 1043a and the input interface 1041 may be disposed on a lower side of the first working coil 106a and disposed over the first blowing fan 118a. The first light source unit 1043a may be disposed at a first point at which the one end of the first air guide 120a and the output end of the first air blowing fan 118a are connected, and the input interface 1041 may be disposed on a lower side of the first point.

The second light source unit 1043b may be disposed on lower sides of the second working coil 106b and the third working coil 106c and disposed over the second air blowing fan 118b. The second light source unit 1043b may be disposed on a lower side of a second point at which the one end of the second air guide 120b and the output end of the second air blowing fan 118b are connected.

The third light source unit 1043c may be disposed on lower sides of the fourth working coil 106d and the fifth working coil 106e, and disposed in an adjacent area over the third air blowing fan 118c, that is, over a left (first) area of the third air blowing fan 118c. The third light source unit 1043c may be disposed on a left (first) side of a lower side of a third point at which the one end of the third air guide 120c and the output end of the third air blowing fan 118c are connected.

Accordingly, air discharged from a gap between the one end of the first air guide 120a and an upper surface of the first air blowing fan 118a may be delivered to the first light source unit 1043a and the input interface 1041, and may cool the first light source unit 1043a and the input interface 1041. Air discharged from a gap between the one end of the second air guide 120b and the upper surface of the second air blowing fan 118b may be delivered to the second light source unit 1043b, and may cool the second light source unit 1043b. Additionally, air discharged from a gap between the one end of the third air guide 120c and the upper surface of the third air blowing fan 118c may be delivered to the third light source unit 1043c, and may cool the third light source unit 1043c.

Most of the air discharged from the gap between the one end of the first air guide 120a and the upper surface of the first air blowing fan 118a may be delivered to the first light source unit 1043a and the input interface 1041, and most of the air discharged from the gap between the one end of the second air guide 120b and the upper surface of the second air blowing fan 118b may be delivered to the second light source unit 1043b. However, as the third light source unit 1043c is disposed in a leftward direction of the gap between the one end of the third air guide 120c and the upper surface of the third air blowing fan 118c, some of the air discharged from the gap between the one end of the third air guide 120c and the upper surface of the third air blowing fan 118c may be delivered to the third light source unit 1043c. In this case, the third light source unit 1043c may not be cooled properly.

Referring to FIGS. 15 and 16, damper member (damper) 1502 may be attached onto the upper surface of the third air blowing fan 118c. That is, the damper member 1502 may guide air, discharged from the gap between the one end of the third air guide 120c and the upper surface of the third air blowing fan 118c, to the third light source unit 1043c in a concentrated manner.

More specifically, one (first) end of the damper member 1502 may be disposed in contact with one end of an upper surface of the one end of the third air guide 120c, and the other (second) end of the damper member 1502 may be disposed in a direction in which the one end of the third light source unit 1043c is disposed.

An angle of the damper member 1502 may vary. For example, when the damper member 1502 is disposed as in FIG. 16, that is, in a direction of 40° with respect to a horizontal line, an amount of air delivered to the third light source unit 1043c may be maximized. Accordingly, most of the air discharged from the gap between the one end of the third air guide 120c and the upper surface of the third air blowing fan 118c may be delivered to the third light source unit 1043c through the damper member 1502 in a concentrated manner, and cooling efficiency of the third light source unit 1043c may be maximized.

The air one or more guides 120a, 120b, 120c according to an embodiment may be manufactured through single processing. Accordingly, costs incurred for manufacturing the one or more air guides 120a, 120b, 120c may be reduced.

In the one or more air guide 120a, 120b, 120c according to an embodiment, the first member 704 configured to prevent leakage of air may prevent air for cooling the one or more heat sink 112a, 112b, 112c from escaping outward.

According to an embodiment, the one or more drive circuit 110a, 110b, 110c and the display unit may all be cooled by a single air blowing fan 118a, 118b, 118c. That is, an additional fan for cooling the display unit is not required. Accordingly, noise generated during driving of the induction heating device 100 may be reduced and manufacturing costs may be reduced.

Embodiments disclosed herein are directed to an electric range in which a single air blowing fan may cool all of a drive circuit configured to control a heating unit, and a display unit configured to display visual information to a user, in a concentrated manner. Further, embodiments disclosed herein are directed to an electric range that may reduce noise generated during an operation. Furthermore, embodiments disclosed herein are directed to an electric range that may help to reduce manufacturing costs.

Advantages are not limited to the above ones, and other advantages not mentioned above may be clearly understood from the description and can be more clearly understood from the embodiments set forth herein.

Embodiments disclosed herein provide an electric range that may include a case; a heating unit disposed in the case, and configured to heat an object to be heated; a drive circuit disposed in the case, and configured to drive the heating unit; a display unit (display) disposed at an upper end of the case, and configured to display visual information on an operation of the heating unit to a user; an air blowing fan disposed on a lower surface of the case, and configured to output air; and an air guide configured to guide air output from the air blowing fan to the drive circuit. The air output from the air blowing fan may be supplied to one (first) end of the air guide.

A height of an upper surface of the one end of the air guide may be greater than a height of an upper surface of the air blowing fan. Some of the air output from the air blowing fan may be discharged through a gap between the upper surface of the one end of the air guide and the upper surface of the air blowing fan, and supplied to the display unit.

The display unit and the air blowing fan may be disposed on a lower side the heating unit. Remaining of the air output from the air blowing fan may be guided to the other end of the air guide. The display unit may be disposed over the air blowing fan or in an adjacent area over the air blowing fan.

The upper surface of the one end of the air guide may comprise a first portion and a second portion. The first portion may be disposed in contact with an upper surface of an output end of the air blowing fan. The gap may be formed between the second portion and the upper surface of the output end of the air blowing fan.

The electric range may further include a damper member (damper) disposed in contact with the upper surface of the air blowing fan. The damper member may be configured to guide air discharged through the gap to the display unit.

The display unit may be disposed in an adjacent area over the air blowing fan and one (first) end of the damper member may be disposed in contact with the upper surface of one end of the air guide. The other (second) end of the damper member may be disposed in a direction in which one end of the display unit is placed.

The air guide may guide the air output from the air blowing fan to a part or portion of the drive circuit. A middle of the air guide may be disposed to encircle a part or portion of the drive circuit.

The air output from the air blowing fan and passing through a part of the drive circuit may be output from the other end of the air guide. A through hole connected to the other end of the air guide may be formed on the lower surface of the case. Air output from the other end of the air guide may be discharged out of the case through the through hole.

The electric range may further include a heat sink disposed over a part or portion of the drive circuit. The heat sink may be disposed inside of the middle of the air guide. The some of the air may be discharged through the gap by colliding with one end of the heat sink or by air pressure between the heat sink and the air blowing fan.

The electric range may further include a cover plate coupled to the upper end of the case. The display unit may include a light source unit configured to emit light to a light display area formed on the cover plate. The display unit may include an input interface buried into the upper surface of the cover plate and configured to display a specific image and receive an input from a user.

The air guide may be manufactured through single processing.

Embodiments disclosed herein provide an electric range that may include a case; a heating unit disposed in the case, and configured to heat an object to be heated; a drive circuit disposed in the case, and configured to drive the heating unit; a heat sink disposed over a part or portion of the drive circuit, and configured to cool a part or portion of the drive circuit; a display unit (display) disposed at an upper end of the case, and configured to display visual information on an operation of the heating unit to a user; an air blowing fan disposed on a lower surface of the case to encircle the heat sink, and configured to output air; and an air guide configured to guide air, output from the air blowing fan, to a part or portion of the drive circuit. A height of at least a part or portion of one (first) end of the air guide is greater than a height of an output end of the air blowing fan. Some of the air output from the air blowing fan may collide with the one end of the heat sink and then may be discharged through a gap between at least a part or portion of the one end of the air guide and the output end of the air blowing fan.

Embodiments disclosed herein provide an air guide included in an electric range that may include a housing having a hollow inside. Air output from an air blowing fan of the electric range may be supplied to one (first) end of the housing, and a height of an upper surface of the one end of the housing may be greater than a height of an output end of the air blowing fan. Some of the air output from the air blowing fan may be discharged through a gap between the upper surface of the one end of the housing and the output end of the air blowing fan.

In an electric range according to embodiments disclosed herein, most of the air output from an air blowing fan may be delivered to a drive circuit through an air guide, and some of the air output from the air blowing fan may be discharged from the air guide and delivered to a display unit, thereby cooling all of the drive circuit and the display unit by a single air blowing fan.

A height of at least a part or portion of one (first) end of an air guide adjacent to an air blowing fan may be a height of an upper surface of the air blowing fan or greater, thereby discharging some of the air output from the air blowing fan out of the air guide and cooling a display unit using the discharged air.

As a single air blowing fan may cool a drive circuit and a display unit, an additional air blowing fan for cooling the display unit is not required, thereby reducing manufacturing costs and noise of an electric range.

According to embodiments disclosed herein, a single air blowing fan may cool all of the drive circuit and the display unit in a concentrated manner. Further, noise generated during operation may be reduced. Furthermore, according to embodiments disclosed herein, costs incurred for manufacturing an electric range may be reduced.

The embodiments are described above with reference to a number of illustrative embodiments thereof. However, the embodiments are not intended to limit the embodiments and drawings set forth herein, and numerous other modifications and embodiments can be devised by one skilled in the art without departing from the technical spirit. Further, effects and predictable effects based on configurations are to be included within the range of the disclosure though not explicitly described in the description of the embodiments.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section could be termed a second element, component, region, layer or section without departing from the teachings of the present invention.

Spatially relative terms, such as "lower", "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative to the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Any reference in this specification to "one embodiment," "an embodiment," "example embodiment," etc., means that a particular feature, structure, or characteristic described in connection with the embodiment is included in at least one embodiment. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An electric range, comprising:
   a case;
   at least one heating unit disposed in the case, and configured to heat an object to be heated;
   at least one drive circuit disposed in the case, and configured to drive the at least one heating unit;
   at least one display disposed at an upper end of the case, and configured to display visual information on an operation of the at least one heating unit to a user;
   at least one air blowing fan disposed on a lower surface of the case, and configured to output air; and
   at least one air guide configured to guide air output from the at least one air blowing fan to the at least one drive circuit, wherein the air output from the at least one air blowing fan is supplied to a first end of the at least one air guide, and a height of an upper surface of the first end of the air guide is greater than a height of an upper surface of the at least one air blowing fan, and wherein a first portion of the air output from the at least one air blowing fan is discharged through a gap between the upper surface of the first end of the at least one air guide and the upper surface of the at least one air blowing fan, and supplied to the at least one display.

2. The electric range of claim 1, wherein the at least one display and the at least one air blowing fan are disposed at a lower side of the at least one heating unit, and a second portion of the air output from the at least one air blowing fan is guided to a second end of the at least one air guide.

3. The electric range of claim 2, wherein the at least one display is disposed over the at least one air blowing fan or in an adjacent area over the at least one air blowing fan.

4. The electric range of claim 1, wherein the upper surface of the first end of the at least one air guide comprises a first portion and a second portion, wherein the first portion is disposed in contact with an upper surface of an output end of the at least one air blowing fan, and wherein the gap is formed between the second portion and the upper surface of the output end of the at least one air blowing fan.

5. The electric range of claim 1, further comprising:
   a damper disposed in contact with the upper surface of the at least one air blowing fan, and configured to guide air discharged through the gap to the at least one display.

6. The electric range of claim 5, wherein the at least one display is disposed in an adjacent area over the at least one air blowing fan, and wherein a first end of the damper is disposed in contact with the upper surface of the first end of the air guide, and a second end of the damper is disposed in a direction in which one end of the at least one display is located.

7. The electric range of claim 1, wherein the at least one air guide guides the air output from the at least one air blowing fan to a portion of the at least one drive circuit, and a middle of the at least one air guide encircles the portion of the at least one drive circuit.

8. The electric range of claim 7, wherein the air, output from the at least one air blowing fan and passing through the portion of the at least one drive circuit, is output from the second end of the at least one air guide, wherein a through hole configured to be connected to the second end of the at least one air guide is formed on the lower surface of the case, and wherein air output from the second end of the at least one air guide is discharged out of the case through the through hole.

9. The electric range of claim 7, further comprising:

at least one heat sink disposed over a portion of the at least one drive circuit, wherein the at least one heat sink is disposed inside of the middle of the at least one air guide.

10. The electric range of claim 9, wherein the first portion of the air is discharged through the gap by colliding with a first end of the at least one heat sink or by air pressure between the at least one heat sink and the at least one air blowing fan.

11. The electric range of claim 1, further comprising:

a cover plate coupled to an upper end of the case, wherein the at least one display includes a light source unit configured to emit light to a light display area formed on the cover plate; and an input interface recessed into an upper surface of the cover plate, and configured to display a specific image and receive an input from a user.

12. An electric range, comprising:

a case;

at least one heating unit disposed in the case, and configured to heat an object to be heated;

at least one drive circuit disposed in the case, and configured to drive the at least one heating unit;

at least one heat sink disposed over a portion of the at least one drive circuit, and configured to cool a portion of the at least one drive circuit;

at least one display disposed at an upper end of the case, and configured to display visual information on an operation of the at least one heating unit to a user;

at least one air blowing fan disposed on a lower surface of the case to encircle the at least one heat sink, and configured to output air;

at least one air guide configured to guide air, output from the at least one air blowing fan, to a portion of the at least one drive circuit, wherein a height of at least a portion of a first end of the at least one air guide is greater than a height of an output end of the at least one air blowing fan, and a first portion of the air output from the at least one air blowing fan collides with one end of the at least one heat sink and then is discharged through a gap between at least a portion of the first end of the at least one air guide and the output end of the at least one air blowing fan.

* * * * *